(12) United States Patent
Crastes (10) Patent No.: US 8,431,901 B2
(45) Date of Patent: Apr. 30, 2013

(54) METHOD AND DEVICE FOR CONTROLLING THE RESISTANCE OF THE SENSITIVE MEMBER OF A BOLOMETRIC SENSOR

(75) Inventor: Arnaud Crastes, Maubec (FR)

(73) Assignee: ULIS, Veurey Voroize (FR)

( * ) Notice: Subject to any disclaimer, the term of this patent is extended or adjusted under 35 U.S.C. 154(b) by 292 days.

(21) Appl. No.: 13/063,337

(22) PCT Filed: Sep. 18, 2009

(86) PCT No.: PCT/FR2009/051758
§ 371 (c)(1),
(2), (4) Date: Mar. 10, 2011

(87) PCT Pub. No.: WO2010/037944
PCT Pub. Date: Apr. 8, 2010

(65) Prior Publication Data
US 2011/0186737 A1    Aug. 4, 2011

(30) Foreign Application Priority Data
Oct. 3, 2008   (FR) ...................................... 08 56698

(51) Int. Cl.
*G01J 5/20* (2006.01)
(52) U.S. Cl.
USPC ................... 250/338.4; 250/352; 250/339.03; 250/339.04; 250/370.15
(58) Field of Classification Search ............... 250/338.4, 250/339.03, 339.04, 370.15
See application file for complete search history.

(56) References Cited

U.S. PATENT DOCUMENTS

| | | | |
|---|---|---|---|
| 6,249,002 B1* | 6/2001 | Butler | 250/338.4 |
| 6,274,869 B1* | 8/2001 | Butler | 250/338.1 |
| 6,441,413 B1* | 8/2002 | Endoh | 257/293 |
| 6,515,285 B1* | 2/2003 | Marshall et al. | 250/352 |
| 6,765,210 B2* | 7/2004 | Oda | 250/338.3 |
| 6,791,610 B1* | 9/2004 | Butler et al. | 348/297 |
| 7,417,230 B2* | 8/2008 | Anderson et al. | 250/338.1 |
| 7,750,301 B1* | 7/2010 | Woolaway et al. | 250/339.09 |
| 2004/0195510 A1* | 10/2004 | Carr et al. | 250/338.3 |
| 2005/0274892 A1 | 12/2005 | Oda | |
| 2007/0120058 A1 | 5/2007 | Blackwell et al. | |

OTHER PUBLICATIONS

Trouilleau C. et al., "35 um pitch at ULIS, a breakthrough" Proceeding of The Spie, Spie, Bellingham, Va, US, vol. 5873, No. Pt. II, Jan. 1, 2005, pp. 578-585, XP007904056.
International Search Report of PCT/FR2009/051758, date of mailing Jan. 29, 2010.

* cited by examiner

*Primary Examiner* — David Porta
*Assistant Examiner* — Taeho Jo
(74) *Attorney, Agent, or Firm* — Westerman, Hattori, Daniels & Adrian, LLP (57) ABSTRACT

The invention relates to a method for controlling the resistance of a bolometer in a bolometer matrix of a sensor, said sensor comprising a circuit for reading said matrix which is capable of addressing said bolometer.
According to the invention, the method comprises a step (46) of adjusting the recurrence of addressing the bolometer using the read circuit.

18 Claims, 3 Drawing Sheets

METHOD AND DEVICE FOR CONTROLLING THE RESISTANCE OF THE SENSITIVE MEMBER OF A BOLOMETRIC SENSOR

FIELD OF THE INVENTION

The invention relates to the field of infra-red imaging and bolometric pyrometry.

To be more specific, the invention relates to devices for the detection of electromagnetic radiation, comprising matrices of sensitive bolometric members, known as elementary bolometers, or more straightforwardly as bolometers, whereof the resistance is controlled, particularly for the purposes of reducing remanence phenomena.

PRIOR ART

In the field of electromagnetic radiation, and particularly infra-red, sensors, there is a known technique of using devices, arranged in the form of a matrix, that are able to operate at ambient temperature, in other words they do not need to be cooled to very low temperatures, unlike the sensing devices known as "quantum sensors" which need to operate at a very low temperature, typically that of liquid nitrogen.

These non-cooled sensors traditionally use the variation in a physical quantity of an appropriate material, as a function of the temperature, in the vicinity of 300K. In the case of bolometric sensors, this physical quantity is the electrical resistivity.

A non-cooled sensor of this kind generally associates:
  means for absorbing the infra-red radiation and converting the same into heat;
  means for thermally insulating the sensor, so as to allow it to warm up under the action of the infra-red radiation;
  thermometry means which, in the context of a bolometric sensor, employ a resistive member;
  means for reading the electrical signals supplied by the thermometry means.

Sensors for use in infra-red imaging are conventionally made in the form of a matrix of elementary sensors, or bolometers, according to one or two dimensions, said bolometers taking the form of membranes suspended above a substrate, generally made out of silicon, via thermally insulating support arms anchored to the substrate. Provision is commonly made in the substrate for means for the sequential addressing of the elementary sensors and means for the electrical excitation and pre-processing of the electrical signals generated by these elementary sensors. This substrate and the integrated means are commonly referred to as a "read circuit".

Conventionally, each bolometer is connected to a transistor with a polarisation capable of injecting a current into the bolometer, and to a capacitive integrator capable of integrating the current flowing in the bolometer so that it can be read.

To obtain an image of the scene observed through the medium of this sensor, the scene is projected through an appropriate optic onto the matrix of elementary sensors (the substrate is arranged in the focal plane of this optic), and timed electrical stimuli are applied through the medium of the read circuit to each of the elementary sensors, or to each row of said sensors, in order to obtain an electrical signal constituting the image of the temperature reached by each of said elementary sensors. This signal is processed in a more or less sophisticated way by the read circuit, and then possibly by an electronic device external to the enclosure in order to generate the thermal image of the scene observed.

The materials commonly used in designing bolometers are known for not being thermally very stable. Also, when bolometers comprising these materials are subjected to infrared fluxes that are too strong (for example observation of a very hot light source such as the sun or an incandescent light fitting), a persistent offset appears in the resistance post-exposure, relative to the resistance pre-exposure. The phase of excessive brightness is termed "overexposure", and the bolometers concerned are then said to be "overexposed". The resistance of an overexposed bolometer then tends to return to its initial value, but over a period of time that may be problematic for the user. We then speak about "remanence" or "memory effect". The output signal (said to be continuous level (CL) when the sensor is placed in front of a uniform scene) of the sensor coming from these bolometers is then offset relative to the (CL) signals coming from the other bolometers in the matrix, and this offset may then even saturate the signal.

Furthermore, regardless of this phenomenon, bolometers are not strictly identical and conventionally have different sensitivities and continuous levels. These dispersions of sensitivity and continuous level are commonly corrected by using tables of gains and offsets established when calibrating the sensor in the plant (a "two-point" correction is then referred to).

Offset correction for its part is typically frequently renewed when the system (camera for example) is in operation through the temporary closure of a shutter which provides a uniform reference scene, and the result is that after an overexposure phase, so long as the signal is not saturated, in other words so long as it remains within the limitations of the electrical dynamics of the processing electronics, the remanence effect is no longer visible on the image, at least for scenes of low dynamics, as soon as an offset correction is applied.

Conversely, the remanent resistance offset produces on the one hand a loss of scene dynamics from the overexposed bolometers subsequent to the offset, and on the other hand a sensitivity offset of said bolometers, which may disturb signal quality on a long-term basis: the effect of overexposing the bolometers is to render the gain correction tables at least temporarily invalid.

How long the remanence phenomenon lasts depends on the flux incident upon the bolometer and on the exposure time thereof. This remanence may last a very long time, up to several months, even if the bolometer is not destroyed.

To overcome the remanence phenomenon, a proposal has been made for the presence of overexposed bolometers to be detected during exposure, and for this overexposure to be limited by using saturable absorbent filters and/or a mechanical shutter in order to protect the sensitive members. However, these techniques cause a loss of sensor use throughout the time the protection is applied, for example during the closure of the shutter, and necessitate additional electronic and mechanical circuits. In fact, the non-availability of the sensor is prejudicial in some uses, so that the length of time during which the image is lost must be as short as possible.

In the document US-A-2005/0274892, a proposal was made for the remanence phenomenon of a bolometric sensor to be reduced by temporarily bringing the focal plane temperature, and therefore also that of the bolometers, to a temperature higher than that to which the overexposed bolometers were subjected during their overexposure, by employing a Peltier-effect module, or TEC (Thermo-Electric Cooler) module, to heat the focal plane.

However, besides the unacceptable fact that it is increasingly common today for bolometric components to be without a Peltier-effect module, which means that other processing methods have to be used, it is observed that eliminating remanence phenomena by using said technique takes several seconds, or even several minutes.

Indeed, this technique uses a plurality of successive heating steps to bring the focal plane to a required temperature in a stable way. Furthermore, heating by Peltier-effect module is expensive in energy since a high, and particularly pulsed, current is used, which induces current inrushes that stress the electronic control members. Lastly, the focal plane temperature (FPT) is modified, and the return of the FPT to a value close to its value prior to the implementation of the protocol previously described requires a relatively prolonged waiting time. But the gains and offsets tables used to correct bolometer dispersions depend on this temperature. Modifying the focal plane temperature therefore necessitates the provision of tables for a plurality of configurations if image availability is to be preserved during the remanence processing process. Drawing up the correction tables is however tricky and expensive in time.

A proposal was also made in this document for the remanence phenomenon to be reduced by modifying the read circuit parameters governing the quantity of current flowing in the bolometer. In this latter case, bolometer polarisation and a longer integration time (or, to be more precise, addressing time) are thus used to heat the bolometer thereby reducing the remanence phenomena.

However, the available power margin offered by these methods to heat the bolometers is relatively small, since both the polarisation and the nominal integration time implemented during normal use are customarily selected in order to optimise sensor performance In fact, the best performance is typically obtained in respect of the maximum polarisation afforded by the read circuit, and the longest integration time compatible with the frame rate. It is not therefore particularly easy to modify these parameters to control the heating of the bolometers beyond the nominal quiescent point.

DISCLOSURE OF THE INVENTION

The purpose of this invention is to resolve the aforementioned problems by proposing a method for controlling the resistance of one or more bolometer(s) of a matrix sensor of the aforementioned type, which is fast and which does not modify the operating point thereof, said sensor comprising a read circuit capable of addressing said bolometer or bolometers.

According to the invention, the method comprises a step of adjusting the recurrence of addressing the bolometer using the read circuit.

The term "addressing" here combines the conventional concept of addressing a bolometer matrix, for the purpose of "designating", via an appropriate switch control, the bolometers which are to be acted upon, and the transmission of current into the bolometers so designated.

This term may, in the interests of simplicity, be likened to the integration time of the prior art, which is strictly speaking to be understood as the time during which the current passing through the bolometer is integrated. It is however quite clear that the heating of the addressed bolometer is related to the polarisation current application time, and therefore to the "addressing time", whatever the integration time may be.

The "frame rate" or frame frequency $f_{frame}$ denotes, as is known per se, the inverse of the elapsed time between two consecutive refreshings of the video flux output from the read circuit. The frame rate therefore corresponds to the number of images, or "frames", delivered by the sensor in the space of one second.

In most sensors, as is the case with the embodiments described hereinafter, a bolometer (or pixel, to adopt a common imaging term) is addressed only once per frame. Thus, in the context of such embodiments, the frame rate also governs the number of addressings per second of a bolometer whereof the resistance is required to be controlled according to the inventive method.

Put another way, in such sensors, adjusting the rate of addressing of a bolometer, according to these definitions, amounts in practice to adjusting the frame rate $f_{frame}$.

The "line rate" or line frequency $f_{line}$ denotes the inverse of the elapsed time between reading two consecutive lines of a single frame using the read circuit. Said elapsed time is understood in relation to the same event on the control timing chart, seen from one line to the next. Mathematically speaking, the line rate corresponds to the number of consecutive lines of a single frame read by the read circuit in the space of one second. The line rate is commonly associated with the case of a line scanning read circuit, and where all the pixels of a single line are addressed simultaneously.

The "pixel rate" or pixel frequency $f_{pixel}$ denotes the predetermined number of consecutive pixels addressed by the read circuit in the space of one second. This term is only employed here in the case of a pixel scanning, or in other words, serial addressing read circuit.

In the prior art described above, and in the particular context of the elimination of remanence, the bolometers were in particular heated by modifying the amplitude and/or the duration of the current passing through them. As far as this invention is concerned, overall heating of the focal plane is not necessary, and the invention can thus be applied to modern-day devices which lack the Peltier-effect module mentioned in the prior art.

According to the invention, bolometer resistance is also controlled by temporarily raising the temperature thereof, but by means of a more frequent current injection, the characteristics of the current remaining furthermore, in a preferred embodiment, unchanged. According to particular modes of implementing the invention, it is however possible to use jointly with a more frequent current injection, a variation in polarisation voltage or/and in addressing time to give one or two additional levers for adjusting the bolometer resistance. Likewise, jointly with a more frequent current injection, it is possible to raise the focal plane temperature by controlling the Peltier-effect module.

The characteristics of the read circuit therefore remain unchanged, and in particular, the polarisation and integration time in the preferential form of the invention, limited to the variation in current injection frequency. As the operating point of the bolometers and the focal plane temperature remain unchanged, it is not therefore necessary to make provision for a plurality of gain and offset tables.

In the context of a reduction in remanence, the applicant has furthermore observed that the inventive method allows a substantial saving of time. Thus, it is possible by means of the inventive method to correct a remanence phenomenon in a few tens of milliseconds, against a few seconds or even minutes in respect of the prior art. This correction process is conveyed by the term "adjust" applied to the bolometer resistance, used in the context of this document.

Moreover, it is possible by means of the inventive method to obtain higher temperatures for the bolometers than those commonly obtained in the prior art. Thus, the applicant has tested that it is easily possible for example, at least in the case of modern sensors whereof the bolometric membranes have high thermal resistance, to bring the bolometers to a temperature at least 180° C. higher than that of the focal plane, whereas the rise in temperature in the prior art using the Peltier-effect module reasonably reaches only a few tens of ° C. Indeed, forcing a very high current in the Peltier-effect modules in order possibly to obtain larger temperature differences is not without risk as regards the likelihood of sensor failure through loss of integrity of the module itself or of other device members, or again in terms of the quality of the vacuum in the sensor enclosure after the operation. Furthermore, very significant power dissipation induces a heat flow which propagates in the enclosure body and beyond in the system, and this is also relatively restrictive for the system, in terms of thermo-mechanical loading and return time to previous conditions.

According to one inventive embodiment, the adjustment step comprises:
  selecting by means of the read circuit a window in the bolometer matrix, said window including the bolometer and having a number of lines L smaller than the total number N of lines of the bolometer matrix;
  selecting by means of the read circuit a frame rate $f_{frame}$ such that $f_{frame} \leq f_{line}/L$ and corresponding to the required recurrence of addressing, where $f_{line}$ is a predetermined line rate; and
  recurrent reading using the read circuit at the rate $f_{frame}$ of the L consecutive lines in the window selected, at the predetermined line rate $f_{line}$, so that the smaller number of lines in the window produces a more frequent addressing of each line thereof and therefore an increase in the recurrence of addressing the bolometer.

Put another way, the inventive sensor is capable of freely windowing the bolometer matrix and reading the bolometers included in said window line by line. Likewise, the inventive sensor is capable of controlling the frame rate independently of the line rate. By choosing a window whereof at least the "height" L is reduced (relative to the full format M), the time spent on addressing all the lines of the window is therefore reduced, so that one line in the window, and therefore the bolometers constituting same, is addressed more frequently. A current therefore flows more often in the bolometers in the window. The dimensions of the window therefore allow the recurrence of addressing, and therefore the heating sustained by the bolometers, to be adjusted.

The most frequent recurrence for a window of given height L, and therefore the greatest heating for said window, is obtained in the scenario where $f_{frame}$ is selected to be equal to $f_{line}/L$, which corresponds to the immediate return to the first line at frame end, as if the last and first lines were adjacent.

The highest achievable level of recurrence, and therefore the greatest achievable heating, is obtained according to the particular choice L=1 and $f_{frame}=f_{line}$, which corresponds to the recurrent addressing of one and the same line at the predetermined line rate.

The value of the rate $f_{frame}$ is usually adjusted by the rate of recurrence of a particular digital pulse, regardless of the other timing controls, formed by the logic of the read circuit and ordinarily known as "frame synchronisation", which triggers the return of the scanning to the first line of the matrix. As a consequence, all the configurations satisfying the relation $f_{frame} \leq f_{line}/L$ are accessible to the read circuits provided with programmable windowing and frame rate adjustment functions. In the general case where the total window scanning time is less than the frame time, there is a "waiting" time during which no line is addressed between two successive frames, with all the more latitude if a windowing on a number of lines smaller than the full format M of the matrix is implemented. At the limit point $f_{frame}=f_{line}/L$, the scanning of the window is uninterrupted.

According to one inventive embodiment, the method comprises, prior to the step of adjusting the recurrence of addressing, a step of selecting the bolometer according to a comparison between its continuous level and the average of the continuous levels of all the bolometers in the matrix, the bolometer being selected if this difference exceeds a predetermined threshold.

In other words, the method applies to advantage to the reduction in the remanence induced by overexposure. A preliminary step of detecting the overexposed bolometers thus allows only the $CL$, image of the resistance, of these to be adjusted.

This is particularly advantageous in the scenario where windowing is carried out. Usually, in fact, the matrix and its associated read circuit are integrated into a hermetic enclosure placed under reduced, and ideally very low, pressure. The effect of heating some members is to release adsorbed or dissolved gases, reducing de facto the service life of the sensor. Thus, a smaller number of heated members limits proportionately the reduction in service life of the sensor.

According to one particular preferred embodiment of the invention, when the recurrence of addressing the bolometer is adjusted, the method comprises a step of closing a shutter fitted to the sensor or the method comprises a defocusing step.

Put another way, closing the shutter cuts the flux incident upon all the bolometers, and in particular upon the overexposed bolometers, thereby allowing the latter to be addressed without adding any additional parasitic effect.

According to one of the particular embodiments of the invention, the recurrence of addressing is variable and comprises at least one first and one second phase, the value of the recurrence of addressing in the first phase being different from the value of the recurrence of addressing in the second phase.

In this way, it is possible to control the resistance of the bolometer more accurately.

According to one particular embodiment of the invention, the method further comprises a step of modifying the polarisation characteristics of the bolometer, and in particular its polarisation voltage.

According to one particular embodiment of the invention, the method further comprises a step of modifying the length of time during which the bolometer is passed through by a current during the addressing thereof.

According to one particular embodiment of the invention, the method further comprises a step of heating the bolometer via a heat source external thereto, and in particular a heat source of the Peltier type.

Another object of the invention is a bolometric detector comprising a bolometer matrix and a matrix read circuit capable of addressing each bolometer thereof.

According to the invention, the read circuit is capable of adjusting the resistance of each bolometer in the matrix by adjusting the recurrence of its addressing.

Put another way, the bolometric detector is capable of implementing a method of the aforementioned type.

BRIEF DESCRIPTION OF THE FIGURES

The invention will be better understood by reading the following description, given solely by way of illustration, and provided in relation to the appended drawings, wherein identical reference numbers denote identical or similar members, and wherein.

DETAILED DESCRIPTION OF THE INVENTION

Figure 1:
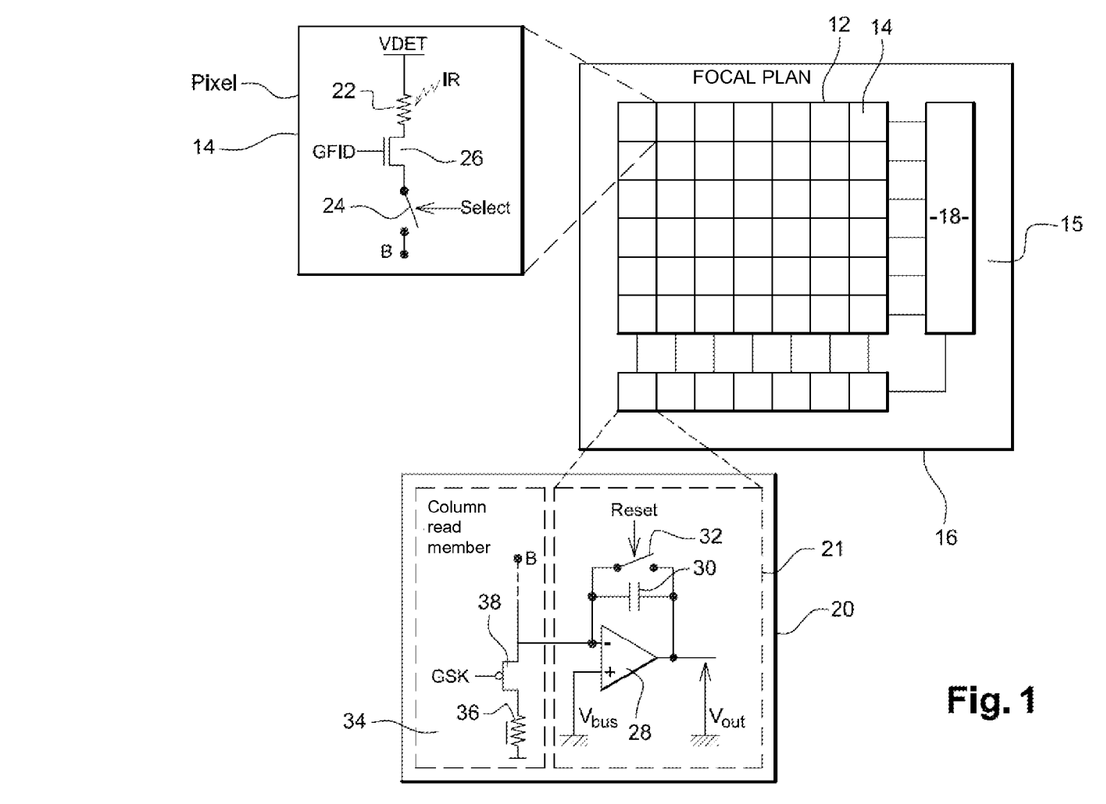
FIG. 1 is a diagrammatic view of a bolometer matrix associated with a read circuit.

A diagrammatic illustration has been given in FIG. 1 of a bolometric sensor comprising a two-dimensional imaging matrix 12 including M lines and N columns of bolometric pixels 14, where N and M are integers greater than or equal to 1. The imaging matrix 12 is arranged in the focal plane 16 of an optic transparent to infra-red radiation (not shown).

The sensor also comprises a read circuit 15 produced in a substrate arranged in the focal plane 16, which carries the imaging matrix 12. The read circuit 15 comprises a circuit for addressing 18 the pixels 14 of the matrix 12, and, for each column thereof, a read member 20 capable of being connected to each pixel 14 of the column by electrical means.

Each pixel 14 comprises a resistive bolometer 22, subjected to an infra-red "IR" radiation, and connected at one of its terminals to a predetermined constant voltage $V_{DET}$. The pixel 14 also comprises a read switch 24, controllable by means of a "Select" signal emitted by the addressing circuit 18, and an MOS injection transistor 26, whereof the gate is set to a predetermined GFID voltage, whereof the source is connected to the other terminal of the bolometer 22, and whereof the drain is connected to one of the terminals of the first selection switch 24.

The read member 20 comprises for its part an integrator 21 formed from:

an operational amplifier 28 whereof the non-inverting input (+) is set to a predetermined constant voltage Vbus, and whereof the inverting input (−) is connected to the other terminal of the read switch 24;

a capacitor 30, of predetermined capacity $C_{int}$, connected between the inverting input (−) of the amplifier 28 and the output thereof; and a reset switch 32 connected in parallel with the capacitor 30, and controllable by means of a "Reset" control.

The read member 20 also comprises a compensation column (also denoted by the French term "ebasage") 34 comprising a compensation bolometer 36, made out of the same material as the bolometer 22 and having low thermal resistance towards the substrate, and an MOS injection transistor 38 for the polarisation of the compensation bolometer 36. The effect of the compensation column 34 is to produce a so-called common mode compensation current (otherwise known as "skimming"), as is known per se from the prior art.

In the example shown, the matrix 12 of pixels 14 is read line by line, the reading of a line of pixels including its connection to the compensation columns 34, as is known per se.

To be more specific, at the start of a read cycle of a bolometer 22 of a line during reading, the reset switch 32, which is in an on-state subsequent to a discharge cycle of the capacitor 30, is switched into the off-state by adjusting the "Reset" control to an appropriate value.

The read switch 24, which is in an off-state, is switched into the on-state by adjusting the "Select" control, and a current passes through the bolometer 22, with the polarisation thereof being adjusted by the MOS transistor 26 using an appropriate control of the GFID gate voltage. This sequence is known as "addressing" the bolometer 22. The length of the polarisation time is therefore imposed by the length of time this switch 24 remains in the on-state phase.

The current passing through the bolometer 22 is then integrated by the capacitor 30 after subtraction of the current passing through the compensation bolometer 36 whereof the polarisation is adjusted by the MOS transistor 38. When a predetermined integration time $\Delta T_{int}$ has elapsed from the start of the read cycle, the addressing switch 24 is switched into its off-state.

According to a first embodiment of the invention, the read circuit 15 is capable of implementing a read-out by windowing the matrix 12, in other words capable of reading only the bolometers of any window 39 (FIG. 2) in the matrix 12 by implementing a programmed limitation of the addressing format, the position and dimensions of this window being defined by means of the read circuit 15 according to the controls programmed by the user, via a serial communication link for example. The choice of said controls is itself guided by calibrating the recurrence of addressing as will be explained in more detail below. The read mode by windowing is known per se and will not be explained in more detail for reasons of conciseness.

It should be noted that the resistance of a particular bolometer is controlled so long as the read circuit 15 is capable of selecting an appropriate number of lines, or even a single line if the control requires it, and of addressing these selected lines recurrently at the selected frame rate.

In the case of a line-by-line mode of reading the matrix 12, all the pixels of a single line are addressed simultaneously, and there is therefore no benefit in terms of processing time according to the invention, in limiting the number of columns in the window below the number of columns N in the matrix 12. However, the user may prefer to apply the polarisation only to one window whereof the number of columns is less than N. For example, in order to further limit the consumption related to implementing the invention, although this consumption is already greatly restricted relative to the prior art when a window comprises the N columns of the matrix, or to avoid applying the thermal correction cycle to bolometers that are on the same lines but do not require correction.

The inventive read circuit therefore comprises at least one programmable windowing function according to a single dimension, namely the number and position of the lines selected, therefore forming a "horizontal" strip. It is sufficient for example in this case to program by serial link for example the number of the first line and the number of lines L to be addressed at each frame. In the case where windowing is preferred according to two dimensions less than the maximum number of lines and columns, for the preceding reasons of consumption and/or polarisation only of the bolometers forming part of the window, said inventive read circuit requires for example an additional switch inserted in series with the switch 24, with the control thereof being activated by column. This switch will be activated in the on-condition in the columns to be corrected, and in the off-position in the columns not requiring correction. It is not necessary to give any further detail on this particular arrangement which will be easily implemented by those skilled in the art when designing the read circuit.

It must furthermore be understood that the read circuit 15 as previously described is only proposed by way of illustration, it being understood that any type of read circuit with voltage polarisation, line-by-line scanned reading and programmable windowing provides all the means to implement the invention.

Figure 2:
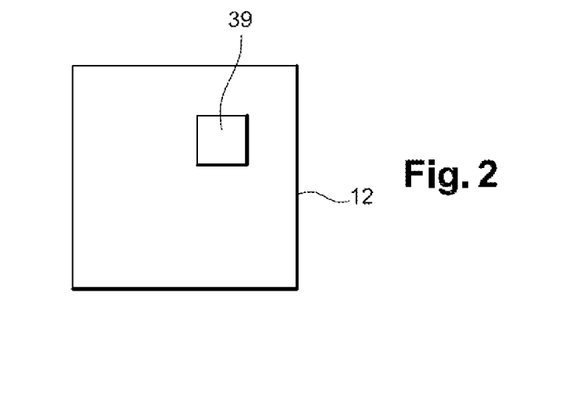
FIG. 2 shows a local window forming part of the complete matrix.

Commonly, as has previously been described, the read circuit 15 reads the matrix 12, or the window 39 thereof, line by line at a predetermined frame rate, conventionally 30 or 60 Hz.

Lastly, the sensor comprises a mechanical shutter (not shown) cutting the flux incident upon the matrix 12, as is known per se.

Figure 4:
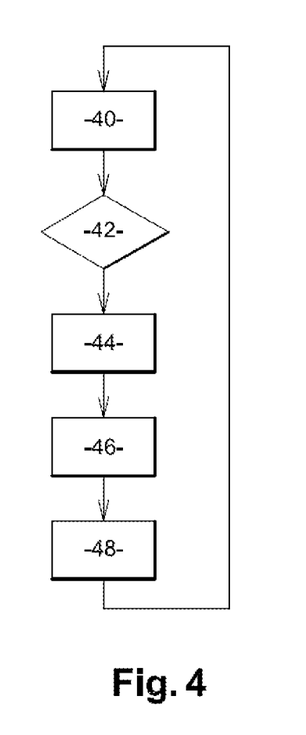
FIG. 4 is an example of how the temperature of a bolometer can be plotted, as a function of time, obtained using the inventive method.

FIG. 4 is a flow chart of a method for reducing the remanence induced for example by an overexposure of bolometers in the matrix 12.

In a first step 40, a detection of overexposed bolometers in the matrix 12 is implemented. For example, the bolometers whereof the output signal, apart from scene brightness in the predetermined reference conditions (given focal plane temperature, shutter closed), differs by a predetermined threshold value from a so-called reference continuous level, are considered to be overexposed. The output signal in such conditions is commonly denoted as the continuous level (CL) of the bolometers. The reference continuous level is to advantage selected to be equal to the average of the continuous levels of the bolometers in the matrix 12, the overexposed bolometers therefore being those whereof the continuous level deviates from the average level observed.

In a more general way, these bolometers will be said subsequently to be "for correction". Indeed, it should be noted that applying the inventive method modifies the resistance (and therefore the CL) of the bolometers detected at step 40, in particular, but not restrictively subsequent to a period of overexposure.

If there are bolometers to be corrected (test step 42), the shutter is closed at 44 or a defocusing of the scene image is implemented.

At 46, a window is then selected around the pixel or pixels for correction. The position and dimensions of this window, and to be more specific the number of lines L thereof, are selected in the first place as a function of the spatial distribution of the bolometers for correction, so that possibly all of them can be corrected in a single correction phase, if the frame rate $f_{frame}$ deemed necessary for their correction allows it. Indeed, the $f_{frame} \leq f_{line}/L$ constraint has to be satisfied. If the window is too extensive, a plurality of successive applications of the method may be necessary, so as to cover all the zone or zones concerned.

The number of addressings of the bolometers, at a given frame rate $f_{frame}$, in order to reach a limitation or elimination of the remanence phenomena is for example determined in a preliminary study, carried out in the plant on test bolometers, which was earlier given the term calibration. This number depends in particular on the polarisation of the bolometers 14, on their design (in other words their physical characteristics), and on the temperature reached during the recurrent addressing procedure. The main so-called design parameters are the electric resistance, the thermal resistance Rth, the variation in the temperature coefficient of resistance TCR, the thermal capacity Cth).

Empirical calibration typically comprises intentionally subjecting in a first phase a sensitive reference (test) retina to a particular overexposure, in terms of radiation power and duration, and measuring the resulting initial continuous level offset. Calibration comprises then measuring, for a predetermined line rate, the temporal evolution of the continuous level offset after applying a recurrent addressing at a given frame rate $f_{frame}$, and to do so for a plurality of periods of time of applying the method (a plurality of numbers of recurrences) so as to obtain if necessary the resistance modification kinetics. The entire process is then restarted with a different frame rate, until sufficient empirical calibration points of the final resistance are obtained according to the parameters of the method.

The dimensions of the windowing applied during this calibration phase are not important, since the number of lines chosen does not limit the range of frame rates intended for exploration. Selecting a single line, as already indicated, gives access to the highest frame rate. The result is the required information on the number of recurrences to be applied as a function of the frame rate in order to eliminate for example 90% of the initial continuous level offset.

This calibration operation may be renewed with a different prior initial continuous level offset (in other words different conditions of overexposure), until a chart is obtained containing the necessary information to programme the application frame rate, in all moderately useful scenarios (in other words so long as the sensitive members are not destroyed) of application of the invention.

The behaviour of the value of the resistance of a bolometer 14 (and consequently, of its continuous level) after the bolometer is returned to the focal plane operating temperature following a correction phase according to the invention, is essentially determined by the temperature to which the bolometer is brought during the correction phase.

It is therefore possible to simplify the calibration phase, by applying a limited series of particular recurrence rate conditions, intended to produce a predetermined series of heating values of the bolometer 14. These values are for example assessed by direct measurement or by numerical simulation.

Said temperature is straightforward to estimate using thermal modelling, starting from known design parameters of the bolometer and Joule excitation parameters. An example of a thermal modelling outcome in a representative scenario is given in FIG. 3.

Conversely, the temporal behaviour in terms of electric resistance, in other words the continuous level evolution after return to ambient temperature (or the operational focal plane temperature) resulting from a given thermal correction cycle, for example according to the invention, applied after a period of overexposure, as a function of the previously estimated temperature, depends in particular on the sensitive material employed. It is not therefore possible or even useful to propose here a general form of analytical expression which would model this behaviour. However, when all the parameters of overexposure on the one hand, and of the remanence reduction process on the other, are set, it is observed that the behaviour is sufficiently deterministic (reproducible), especially as there is no need for accuracy to obtain the sought after effect, in order to be applicable to all products built from the same type of elementary bolometer.

It is as a result pertinent to apply a simple analytical relation, based on the empirical acquisition previously mentioned, which very quickly provides, and for a wide range of initial conditions, an order of magnitude of the recurrence rate and of the number of recurrences (the duration of the recurrent addressing phase) to be preferentially applied, according for example to the choice of the most practical, or the fastest, operating conditions to achieve the required purpose.

Still at 46, the line rate used for the line-by-line addressing of the L lines the window 39 is chosen to be constant and equal to the line rate $f_{line}$ used during the full format reading of the matrix 12, and the frame rate is chosen according to the outcome of the calibration, under the constraint $f_{frame} \leq f_{line}/L$, so as to obtain the required result in terms of final resistance (of the final CL) after return to the operating temperature. Indeed, by retaining the line rate and because of the restricted number of lines in the window 39, an increase in the frame rate, and therefore in the recurrence of addressing the bolometers in this window, is made possible.

Once the window and the frame rate have been selected, said window is addressed line by line using the read circuit 15 at the line rate $f_{line}$ used for the full format reading of the matrix 12, for a predetermined length of time defined for example according to an empirical criterion as disclosed previously. The frame rate $f_{frame}$ selected is typically applied by means of the digital frame synchronisation control usually provided in all read circuits, as previously indicated.

Figure 3:
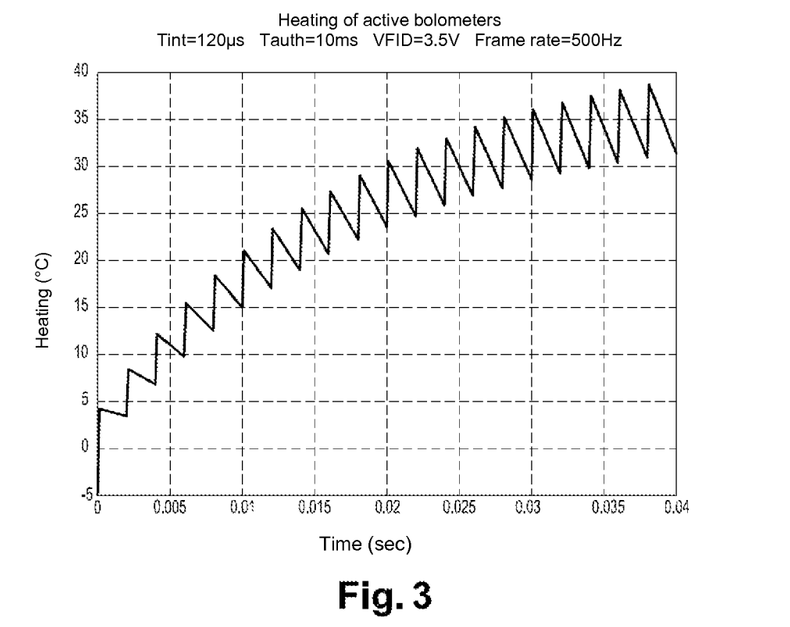
FIG. 3 is a flow chart of an inventive method.

The temperature profile of a selected bolometer in the window is shown in FIG. 3.

This profile alternates periods of quasi-linear increase in the temperature of the bolometer, during which the bolometer is addressed, with periods of free cooling of the bolometer, during which the bolometer is not addressed.

As may be noted, the average temperature of the bolometer increases on account of a high addressing rate thereof. Indeed, the window comprises a reduced number of lines compared with the full format of the matrix 12. As a result, all these lines are scanned fast, a single line being read again before bolometers thereof cool down completely.

In fact, the average temperature (as considered over the duration of a line time) increases. Beyond a number of addressings greater than about 3 times the thermal time constant of the bolometer, in other words typically 15 to 30 milliseconds, the average temperature (on a line time) no longer increases. This stabilisation is the result of the equilibrium between the effective electrical power dissipated by Joule effect in the bolometer, and the thermal losses, mainly by conduction towards the substrate which has remained at its start temperature.

Referring again to FIG. 4, the method continues at 48 with the end of the recurrent reading of the window and the opening of the shutter, and then re-loops to the detection step 40. The remanence of the overexposed bolometers is thus reduced in amplitude and duration, if not eliminated.

In this way a continuous level offset is obtained, after return to the ordinary normal mode of operation, available immediately since without change in the focal plane temperature, that is negligible, or at the very least smaller than a predetermined difference threshold acceptable for a nominal operation of the bolometers selected relative to the other bolometers in the matrix.

An embodiment has been described wherein a window of fixed dimensions comprising pixels for correction is selected.

As an alternative, during the procedure for reducing the remanence phenomena, the dimensions of the window vary over time, or the frame rate vary over time. The temporal profile of the average temperature of the bolometers for correction may thus be accurately controlled. As a result, the final resistance is accurately controlled. For example, a high frame rate is selected initially, in order to obtain a significant average rise in temperature, and then a lower frame rate is selected in a second phase in order to obtain a more moderate increase in the average temperature (relative to the initial temperature). The average temperature of the bolometers is thus adjusted gradually. In relation, the number of lines L in the scanned window may be adapted if necessary between the first and second phases, to ensure compatibility between the number of lines L and the frame rate: $f_{frame} \leq f_{line}/L$.

Likewise an embodiment has been described wherein the addressing or integration time is unchanged relative to the nominal operation. As an alternative, the addressing or integration time is also modified.

Likewise an embodiment has been described wherein the polarisation voltage of the bolometers is unchanged relative to the nominal operation. As an alternative, the polarisation voltage is also modified.

Likewise an embodiment has been described wherein the Peltier effect module, when it exists, is not used to heat the focal plane. As an alternative, this Peltier effect module is also used.

Likewise an embodiment has been described wherein the bolometer matrix is read line by line. The invention also applies to bolometer matrices read pixel by pixel. In such a case, the read circuit is capable of individually addressing the pixels sequentially one by one in a so-called serial manner.

The same advantages as have been described previously in relation to line-by-line reading will be obtained from said serial read circuit provided with a function for windowing a series of contiguous pixels. The adjustment of the frame rate made possible by the reduced number of pixels to be read, leads to an adjustment of the resistance of the pixels addressed at said frame rate after return to ordinary thermal conditions.

The condition to be met between the extension of the window and the accessible frame rate becomes in this instance $f_{frame} \leq f_{pixel}/P$, where P is the number of pixels in the window. The highest temperature is obtained by addressing a single pixel (bolometer) at a frame rate N×M times higher than the nominal frame rate of the full format of the matrix.

Clearly, it will be understood that the invention is not restricted to the bolometric sensor described in relation to FIG. 1, but applies to any type of bolometric sensor.

The description given is of a preferred use of the invention in correcting remanence. Clearly, it is conceivable to use the invention in other situations requiring bolometer resistance to be modified.

By means of the invention, the following advantages have been obtained:
- the time during which the sensor is unavailable is limited. Indeed, in a few tens of milliseconds, a substantial reduction in remanence phenomena, if not the complete elimination thereof, is already observed;
- the electric consumption induced by implementing the inventive method is reduced. Indeed, the reduction in remanence phenomena implemented according to the invention does not require the use of high energy-consuming equipment, such as a Peltier-effect module for example;
- the inventive method modifies neither the focal plane temperature (first order), nor the current characteristics (polarisation, integration time). The tables used for the correction of gain and offset dispersions in the matrix therefore remain valid from the end of the resistance correction process;
- increased efficiency in the reduction of remanence phenomena is obtained, since the temperatures accessible by means of the invention are higher than what is achieved under the prior art, and furthermore can be applied jointly (cumulatively) with an adjustment of the integration time, or/and of the polarisation voltage of the bolometers, or/and the use of the Peltier-effect module, if there is one;
- the design of the bolometric sensors remains unchanged since none of their characteristics, such as the polarisation of the bolometers or the integration time (which corresponds in most cases to the addressing time), needs to be modifiable; and
- deterioration in the service life or reliability of the sensor is moderated in particular by the fact that no electrical and thermal loading is imposed on the members in the enclosure, and by the fact that a very small number of members internal to the vacuum enclosure is involved thermally in a correction, moreover localised, of the remanence phenomena.

The invention claimed is:

1. A method for controlling the resistance of a bolometer in a bolometer matrix of a sensor, said sensor comprising a circuit for reading said matrix which is capable of addressing said bolometer, wherein the method comprises a step of adjusting the recurrence of addressing the bolometer using the read circuit, wherein the adjustment step comprises:
   selecting by means of the read circuit a window of the bolometer matrix, said window including the bolometer and having a number of lines L smaller than the total number N of lines in the bolometer matrix;
   selecting by means of the read circuit a frame rate $f_{frame}$ such that $f_{frame} < f_{line}/L$ and corresponding to the required recurrence of addressing, where $f_{line}$ is a predetermined line rate; and
   the recurrent reading by the read circuit at the frame rate $f_{frame}$ of the L lines in the window selected, at the predetermined line rate $f_{line}$, so that the lower number of lines in the window produces a more frequent addressing of each line thereof and therefore an increase in the recurrence of addressing the bolometer.

2. The method as claimed in claim 1, which comprises, prior to the step of adjusting the recurrence of addressing, a step of selecting the bolometer according to a comparison between its continuous level and the average of the continuous levels of all the bolometers in the matrix, the bolometer being selected if this difference exceeds a predetermined threshold.

3. The method as claimed in claim 1, wherein when the recurrence of addressing the bolometer is adjusted, the method comprises a step of closing a shutter fitted to the sensor or the method comprises a defocusing step.

4. The method as claimed in claim 1, wherein the recurrence of addressing is variable and comprises at least one first and one second phase, the value of the recurrence of addressing in the first phase being different from the value of the recurrence of addressing in the second phase.

5. The method as claimed in claim 1, wherein it further comprises a step of modifying the polarisation characteristics of the bolometer, and in particular its polarisation voltage.

6. The method as claimed in claim 1, wherein it further comprises a step of modifying the length of time during which the bolometer is passed through by a current during the addressing thereof 7. The method as claimed in claim 1, wherein it further comprises a step of heating the bolometer using a heat source external thereto, and in particular a heat source of the Peltier type.

8. The method as claimed in claim 1, wherein the bolometers in the bolometer matrix can be addressed independently of one another.

9. A bolometric detector including a bolometer matrix and a circuit for reading the matrix, which is capable of addressing each bolometer thereof, wherein the read circuit adjusts the resistance of each bolometer in the matrix by:
   selecting a window of the bolometer matrix, said window including the bolometer and having a number of lines L smaller than the total number N of lines in the bolometer matrix;
   selecting a frame rate $f_{frame}$ such that $f_{frame} <$ and corresponding to the required recurrence of addressing, where $f_{line}$ is a predetermined line rate; and
   recurrent reading at the frame rate $f_{frame}$ of the L lines in the window selected, at the predetermined line rate $f_{line}$, so that the lower number of lines in the window produces a more frequent addressing of each line thereof and therefore an increase in the recurrence of addressing the bolometer.

10. The bolometric detector as claimed in claim 9, comprising a sensor, said sensor comprising the bolometer matrix and the circuit for reading said matrix.

11. The method as claimed in claim 2, wherein when the recurrence of addressing the bolometer is adjusted, the method comprises a step of closing a shutter fitted to the sensor or the method comprises a defocusing step.

12. The method as claimed in claim 11, wherein the recurrence of addressing is variable and comprises at least one first and one second phase, the value of the recurrence of addressing in the first phase being different from the value of the recurrence of addressing in the second phase.

13. The method as claimed in claim 2, wherein the recurrence of addressing is variable and comprises at least one first and one second phase, the value of the recurrence of addressing in the first phase being different from the value of the recurrence of addressing in the second phase.

14. The method as claimed in claim 3, wherein the recurrence of addressing is variable and comprises at least one first and one second phase, the value of the recurrence of addressing in the first phase being different from the value of the recurrence of addressing in the second phase.

15. The method as claimed in claim 11, wherein it further comprises a step of modifying the polarisation characteristics of the bolometer, and in particular its polarisation voltage.

16. The method as claimed in claim 2, wherein it further comprises a step of modifying the polarisation characteristics of the bolometer, and in particular its polarisation voltage.

17. The method as claimed in claim 11, wherein it further comprises a step of modifying the length of time during which the bolometer is passed through by a current during the addressing thereof 18. The method as claimed in claim 11, wherein it further comprises a step of heating the bolometer using a heat source external thereto, and in particular a heat source of the Peltier type.

* * * * *